(12) United States Patent
Flemming et al.

(10) Patent No.: US 11,677,373 B2
(45) Date of Patent: Jun. 13, 2023

(54) IMPEDENCE MATCHING CONDUCTIVE STRUCTURE FOR HIGH EFFICIENCY RF CIRCUITS

(71) Applicant: 3D Glass Solutions, Inc., Albuquerque, NM (US)

(72) Inventors: Jeb H. Flemming, Albuquerque, NM (US); Kyle McWethy, Albuquerque, NM (US)

(73) Assignee: 3D Glass Solutions, Inc., Albuquerque, NM (US)

( * ) Notice: Subject to any disclaimer, the term of this patent is extended or adjusted under 35 U.S.C. 154(b) by 0 days.

(21) Appl. No.: 16/767,096

(22) PCT Filed: Dec. 31, 2018

(86) PCT No.: PCT/US2018/068184
§ 371 (c)(1),
(2) Date: May 26, 2020

(87) PCT Pub. No.: WO2019/136024
PCT Pub. Date: Jul. 11, 2019

(65) Prior Publication Data
US 2020/0382089 A1    Dec. 3, 2020

Related U.S. Application Data

(60) Provisional application No. 62/613,735, filed on Jan. 4, 2018.

(51) Int. Cl.
*C03C 15/00* (2006.01)
*H03H 7/38* (2006.01)
(Continued)

(52) U.S. Cl.
CPC ............ *H03H 7/38* (2013.01); *C03C 4/04* (2013.01); *C03C 15/00* (2013.01); *G06F 30/392* (2020.01);
(Continued)

(58) Field of Classification Search
CPC ............ C03C 15/00; C03C 2218/34; H05K 3/0017; H05K 3/107
See application file for complete search history.

(56) References Cited

U.S. PATENT DOCUMENTS 2,515,937 A   12/1943   Stookey
2,515,943 A   1/1949    Stookey
(Continued)

FOREIGN PATENT DOCUMENTS

CN    1562831 A     4/2004
CN    105047558 A   11/2015
(Continued)

OTHER PUBLICATIONS

Papapolymerou et al. ("Micromachined Patch Antennas", IEEE Transactions on Antennas and Propagation, vol. 46; No. 2, Feb. 1998; pp. 275-283). (Year: 1998).*
(Continued)

*Primary Examiner* — Binh X Tran
(74) *Attorney, Agent, or Firm* — Edwin S. Flores; Chalker Flores, LLP (57) ABSTRACT

The present invention includes a method of making a RF impedance matching device in a photo definable glass ceramic substrate. A ground plane may be used to adjacent to or below the RF Transmission Line in order to prevent parasitic electronic signals, RF signals, differential voltage build up and floating grounds from disrupting and degrading the performance of isolated electronic devices by the fabri-
(Continued)

cation of electrical isolation and ground plane structures on a photo-definable glass substrate.

24 Claims, 5 Drawing Sheets (51) Int. Cl.
G06F 30/392 (2020.01)
H01L 23/64 (2006.01)
H05K 1/02 (2006.01)
H05K 1/03 (2006.01)
C03C 4/04 (2006.01)
H05K 3/10 (2006.01)
H05K 3/00 (2006.01)
C03C 3/095 (2006.01)

(52) U.S. Cl.
CPC ............. *H01L 23/64* (2013.01); *H05K 1/025* (2013.01); *H05K 1/0306* (2013.01); *H05K 3/107* (2013.01); *C03C 3/095* (2013.01); *C03C 2218/34* (2013.01); *H05K 3/0017* (2013.01); *H05K 3/0023* (2013.01)

(56) References Cited

U.S. PATENT DOCUMENTS

| | | |
|---|---|---|
| 2,515,940 A | 7/1950 | Stookey |
| 2,515,941 A | 7/1950 | Stookey |
| 2,628,160 A | 2/1953 | Stookey |
| 2,684,911 A | 7/1954 | Stookey |
| 2,971,853 A | 2/1961 | Stookey |
| 3,281,264 A | 10/1966 | Cape et al. |
| 3,292,115 A | 12/1966 | La Rosa |
| 3,904,991 A | 9/1975 | Ishli et al. |
| 3,985,531 A | 10/1976 | Grossman |
| 3,993,401 A | 11/1976 | Strehlow |
| 4,029,605 A | 6/1977 | Kosiorek |
| 4,131,516 A | 12/1978 | Bakos et al. |
| 4,413,061 A | 11/1983 | Kumar |
| 4,444,616 A | 4/1984 | Fujita et al. |
| 4,514,053 A | 4/1985 | Borelli et al. |
| 4,537,612 A | 8/1985 | Borelli et al. |
| 4,611,882 A | 9/1986 | Susumu |
| 4,647,940 A | 3/1987 | Traut et al. |
| 4,692,015 A | 9/1987 | Loce et al. |
| 4,788,165 A | 11/1988 | Fong et al. |
| 4,942,076 A | 7/1990 | Panicker et al. |
| 5,078,771 A | 1/1992 | Wu |
| 5,147,740 A | 9/1992 | Robinson |
| 5,212,120 A | 5/1993 | Araujo et al. |
| 5,215,610 A | 6/1993 | Dipaolo et al. |
| 5,352,996 A | 10/1994 | Kawaguchi |
| 5,371,466 A | 12/1994 | Arakawa et al. |
| 5,374,291 A | 12/1994 | Yabe et al. |
| 5,395,498 A | 3/1995 | Gombinsky et al. |
| 5,409,741 A | 4/1995 | Laude |
| 5,733,370 A | 3/1998 | Chen et al. |
| 5,779,521 A | 7/1998 | Muroyama et al. |
| 5,850,623 A | 12/1998 | Carman, Jr. et al. |
| 5,902,715 A | 5/1999 | Tsukamoto et al. |
| 5,919,607 A | 7/1999 | Lawandy et al. |
| 5,998,224 A | 12/1999 | Rohr et al. |
| 6,066,448 A | 5/2000 | Wohlstadter et al. |
| 6,094,336 A | 7/2000 | Weekamp |
| 6,136,210 A | 10/2000 | Biegelsen et al. |
| 6,171,886 B1 | 1/2001 | Ghosh |
| 6,258,497 B1 | 7/2001 | Kropp et al. |
| 6,287,965 B1 | 9/2001 | Kang et al. |
| 6,329,702 B1 | 12/2001 | Gresham et al. |
| 6,373,369 B2 | 4/2002 | Huang et al. |
| 6,383,566 B1 | 5/2002 | Zagdoun |
| 6,485,690 B1 | 11/2002 | Pfost et al. |
| 6,495,411 B1 | 12/2002 | Mei |
| 6,511,793 B1 | 1/2003 | Cho et al. |
| 6,514,375 B2 | 2/2003 | Kijima |
| 6,562,523 B1 | 2/2003 | Wu et al. |
| 6,678,453 B2 | 1/2004 | Bellman et al. |
| 6,686,824 B1 | 2/2004 | Yamamoto et al. |
| 6,771,860 B2 | 8/2004 | Frezza et al. |
| 6,783,920 B2 | 8/2004 | Livingston et al. |
| 6,824,974 B2 | 11/2004 | Pisharody et al. |
| 6,830,221 B1 | 12/2004 | Janson et al. |
| 6,843,902 B1 | 1/2005 | Penner et al. |
| 6,875,544 B1 | 4/2005 | Sweatt et al. |
| 6,932,933 B2 | 8/2005 | Halvajian et al. |
| 6,977,722 B2 | 12/2005 | Wohlstadter et al. |
| 7,033,821 B2 | 4/2006 | Kim et al. |
| 7,064,045 B2 | 6/2006 | Kang |
| 7,132,054 B1 | 11/2006 | Kravitz et al. |
| 7,179,638 B2 | 2/2007 | Anderson |
| 7,277,151 B2 | 10/2007 | Ryu et al. |
| 7,306,689 B2 | 12/2007 | Okubora et al. |
| 7,326,538 B2 | 2/2008 | Pitner et al. |
| 7,407,768 B2 | 8/2008 | Yamazaki et al. |
| 7,410,763 B2 | 8/2008 | Su et al. |
| 7,439,128 B2 | 10/2008 | Divakaruni |
| 7,470,518 B2 | 12/2008 | Chiu et al. |
| 7,497,554 B2 | 3/2009 | Okuno |
| 7,603,772 B2 | 10/2009 | Farnsworth et al. |
| 7,948,342 B2 | 5/2011 | Long |
| 8,062,753 B2 | 11/2011 | Schreder et al. |
| 8,076,162 B2 | 12/2011 | Flemming et al. |
| 8,096,147 B2 | 1/2012 | Flemming et al. |
| 8,361,333 B2 | 1/2013 | Flemming et al. |
| 8,492,315 B2 | 7/2013 | Flemming et al. |
| 8,709,702 B2 | 4/2014 | Flemming et al. |
| 9,385,083 B1 | 7/2016 | Herrault et al. |
| 9,449,753 B2 | 9/2016 | Kim |
| 9,635,757 B1 | 4/2017 | Chen et al. |
| 9,755,305 B2 | 9/2017 | Desclos et al. |
| 9,819,991 B1 | 11/2017 | Rajagopalan et al. |
| 10,070,533 B2 * | 9/2018 | Flemming ............... H01L 23/15 |
| 10,201,091 B2 * | 2/2019 | Flemming ............ H05K 3/0023 |
| 10,201,901 B2 | 2/2019 | Flemming et al. |
| 2001/0051584 A1 | 12/2001 | Harada et al. |
| 2002/0015546 A1 | 2/2002 | Bhagavatula |
| 2002/0086246 A1 | 7/2002 | Lee |
| 2002/0100608 A1 | 8/2002 | Fushie et al. |
| 2003/0025227 A1 | 2/2003 | Daniell |
| 2003/0107459 A1 | 6/2003 | Takahashi et al. |
| 2003/0124716 A1 | 7/2003 | Hess et al. |
| 2003/0135201 A1 | 7/2003 | Gonnelli |
| 2003/0143802 A1 | 7/2003 | Chen et al. |
| 2003/0156819 A1 | 8/2003 | Pruss et al. |
| 2003/0174944 A1 | 9/2003 | Dannoux |
| 2003/0228682 A1 | 12/2003 | Lakowicz et al. |
| 2003/0231830 A1 | 12/2003 | Hikichi |
| 2004/0008391 A1 | 1/2004 | Bowley et al. |
| 2004/0020690 A1 | 2/2004 | Parker et al. |
| 2004/0155748 A1 | 8/2004 | Steingroever |
| 2004/0171076 A1 | 9/2004 | Dejneka et al. |
| 2004/0184705 A1 | 9/2004 | Shimada et al. |
| 2004/0198582 A1 | 10/2004 | Borrelli et al. |
| 2004/0227596 A1 | 11/2004 | Nguyen et al. |
| 2005/0089901 A1 | 4/2005 | Porter et al. |
| 2005/0105860 A1 | 5/2005 | Oono |
| 2005/0150683 A1 | 7/2005 | Farnworth et al. |
| 2005/0170670 A1 | 8/2005 | King et al. |
| 2005/0212432 A1 | 9/2005 | Neil et al. |
| 2005/0277550 A1 | 12/2005 | Brown et al. |
| 2006/0092079 A1 | 5/2006 | Rochemont |
| 2006/0118965 A1 | 6/2006 | Matsui |
| 2006/0147344 A1 | 7/2006 | Ahn et al. |
| 2006/0158300 A1 | 7/2006 | Korony et al. |
| 2006/0159916 A1 | 7/2006 | Dubrow et al. |
| 2006/0171033 A1 | 8/2006 | Shreder et al. |
| 2006/0177855 A1 | 8/2006 | Utermohlen et al. |
| 2006/0188907 A1 | 8/2006 | Lee et al. |
| 2006/0193214 A1 | 8/2006 | Shimano et al. |
| 2006/0283948 A1 | 12/2006 | Naito |
| 2007/0023386 A1 | 2/2007 | Kravitz et al. |
| 2007/0120263 A1 | 5/2007 | Gabric et al. |

(56) References Cited

U.S. PATENT DOCUMENTS

| | | |
|---|---|---|
| 2007/0121263 A1 | 5/2007 | Liu et al. |
| 2007/0155021 A1 | 7/2007 | Zhang et al. |
| 2007/0158787 A1 | 7/2007 | Chanchani |
| 2007/0248126 A1 | 10/2007 | Liu et al. |
| 2007/0267708 A1 | 11/2007 | Courcimault |
| 2007/0272829 A1 | 11/2007 | Nakagawa et al. |
| 2007/0279837 A1 | 12/2007 | Chow et al. |
| 2007/0296520 A1 | 12/2007 | Hosokawa et al. |
| 2008/0079565 A1 | 4/2008 | Koyama |
| 2008/0136572 A1 | 6/2008 | Ayasi et al. |
| 2008/0174976 A1 | 7/2008 | Satoh et al. |
| 2008/0182079 A1 | 7/2008 | Mirkin et al. |
| 2008/0223603 A1 | 9/2008 | Kim et al. |
| 2008/0226228 A1 | 9/2008 | Tamura |
| 2008/0245109 A1 | 10/2008 | Flemming et al. |
| 2008/0291442 A1 | 11/2008 | Lawandy |
| 2008/0305268 A1 | 12/2008 | Norman et al. |
| 2008/0316678 A1 | 12/2008 | Ehrenberg et al. |
| 2009/0029185 A1 | 1/2009 | Lee et al. |
| 2009/0075478 A1 | 3/2009 | Matsui |
| 2009/0130736 A1 | 5/2009 | Collis et al. |
| 2009/0170032 A1 | 7/2009 | Takahashi et al. |
| 2009/0182720 A1 | 7/2009 | Cain et al. |
| 2009/0243783 A1 | 10/2009 | Fouquet et al. |
| 2009/0290281 A1 | 11/2009 | Nagamoto et al. |
| 2010/0022416 A1 | 1/2010 | Flemming et al. |
| 2010/0059265 A1 | 3/2010 | Myung-Soo |
| 2010/0237462 A1 | 9/2010 | Beker et al. |
| 2011/0003422 A1 | 1/2011 | Katragadda et al. |
| 2011/0045284 A1 | 2/2011 | Matsukawa et al. |
| 2011/0065662 A1 | 3/2011 | Rinsch et al. |
| 2011/0108525 A1 | 5/2011 | Chien et al. |
| 2011/0170273 A1 | 7/2011 | Helvajian |
| 2011/0195360 A1 | 8/2011 | Flemming et al. |
| 2011/0217657 A1 | 9/2011 | Flemming et al. |
| 2011/0284725 A1 | 11/2011 | Goldberg |
| 2011/0304999 A1 | 12/2011 | Yu et al. |
| 2012/0080612 A1 | 4/2012 | Grego |
| 2012/0161330 A1 | 6/2012 | Hlad et al. |
| 2013/0001770 A1 | 1/2013 | Liu |
| 2013/0015467 A1 | 1/2013 | Krumbein et al. |
| 2013/0119401 A1 | 5/2013 | D'Evelyn et al. |
| 2013/0142998 A1 | 6/2013 | Flemming et al. |
| 2013/0183805 A1 | 7/2013 | Wong et al. |
| 2013/0209026 A1 | 8/2013 | Doany et al. |
| 2013/0233202 A1 | 9/2013 | Cao et al. |
| 2013/0278568 A1 | 10/2013 | Lasiter et al. |
| 2013/0308906 A1 | 11/2013 | Zheng et al. |
| 2013/0337604 A1 | 12/2013 | Ozawa et al. |
| 2014/0002906 A1 | 1/2014 | Shibuya |
| 2014/0035540 A1 | 2/2014 | Ehrenberg |
| 2014/0035892 A1 | 2/2014 | Shenoy |
| 2014/0035935 A1 | 2/2014 | Shenoy et al. |
| 2014/0070380 A1 | 3/2014 | Chiu et al. |
| 2014/0104284 A1 | 4/2014 | Shenoy et al. |
| 2014/0144681 A1 | 5/2014 | Pushparaj et al. |
| 2014/0145326 A1 | 5/2014 | Lin et al. |
| 2014/0169746 A1 | 6/2014 | Hung et al. |
| 2014/0203891 A1 | 7/2014 | Yazak |
| 2014/0247269 A1 | 9/2014 | Berdy et al. |
| 2014/0272688 A1 | 9/2014 | Dillion |
| 2014/0367695 A1 | 12/2014 | Barlow |
| 2015/0048901 A1 | 2/2015 | Rogers |
| 2015/0071593 A1 | 3/2015 | Kanke |
| 2015/0210074 A1 | 7/2015 | Chen et al. |
| 2015/0228712 A1 | 8/2015 | Yun |
| 2015/0263429 A1 | 9/2015 | Vahidpour et al. |
| 2015/0277047 A1 | 10/2015 | Flemming et al. |
| 2016/0048079 A1 | 2/2016 | Lee et al. |
| 2016/0152505 A1 | 6/2016 | Fushie |
| 2016/0181211 A1 | 6/2016 | Kamgaing et al. |
| 2016/0185653 A1 | 6/2016 | Fushie |
| 2016/0254579 A1 | 9/2016 | Mills |
| 2016/0265974 A1 | 9/2016 | Erte et al. |
| 2016/0268665 A1 | 9/2016 | Sherrer et al. |
| 2016/0320568 A1 | 11/2016 | Haase |
| 2016/0380614 A1 | 12/2016 | Abbott et al. |
| 2017/0003421 A1 | 1/2017 | Flemming et al. |
| 2017/0077892 A1 | 3/2017 | Thorup |
| 2017/0094794 A1 | 3/2017 | Flemming et al. |
| 2017/0098501 A1 | 4/2017 | Flemming et al. |
| 2017/0213762 A1 | 7/2017 | Gouk |
| 2018/0310399 A1 | 10/2018 | Nair et al. |
| 2018/0315811 A1 | 11/2018 | Cho et al. |
| 2018/0323485 A1 | 11/2018 | Gnanou et al. |
| 2019/0093233 A1 | 3/2019 | Flemming et al. |
| 2019/0280079 A1 | 7/2019 | Bouvier et al. |
| 2020/0060513 A1 | 2/2020 | Ito et al. |
| 2020/0235020 A1 | 7/2020 | Boek |
| 2020/0243248 A1 | 7/2020 | Flemming et al. |
| 2020/0275558 A1 | 8/2020 | Fujita |

FOREIGN PATENT DOCUMENTS

| | | | |
|---|---|---|---|
| CN | 105938928 | 9/2016 | |
| CN | 210668058 U | 6/2020 | |
| DE | 102004059252 A1 | 1/2006 | |
| EP | 0311274 A1 | 12/1989 | |
| EP | 0507719 A1 | 10/1992 | |
| EP | 0685857 B1 | 12/1995 | |
| EP | 0949648 A1 | 10/1999 | |
| EP | 1487019 A1 | 12/2004 | |
| EP | 1683571 A1 | 6/2006 | |
| JP | 56-155587 | 12/1981 | |
| JP | 61149905 | 7/1986 | |
| JP | 61231529 A | 10/1986 | |
| JP | 62202840 A | 9/1987 | |
| JP | 63-128699 A | 6/1988 | |
| JP | 08026767 A | 6/1988 | |
| JP | H393683 A | 4/1991 | |
| JP | 05139787 A | 6/1993 | |
| JP | 08179155 A | 12/1994 | |
| JP | 10007435 A | 1/1998 | |
| JP | 10199728 A | 7/1998 | |
| JP | 11344648 A | 12/1999 | |
| JP | 2000228615 A | 8/2000 | |
| JP | 2001033664 A | 2/2001 | |
| JP | 2001206735 A | 7/2001 | |
| JP | 2005302987 A | 10/2005 | |
| JP | 2005215644 A | 11/2005 | |
| JP | 2006032982 A | 2/2006 | |
| JP | 2006179564 A | 6/2006 | |
| JP | 2008252797 A | 10/2008 | |
| JP | 2011192836 A | 9/2011 | |
| JP | 2012079960 A | 4/2012 | |
| JP | 2013062473 A | 4/2013 | |
| JP | 2013217989 A | 10/2013 | |
| JP | 2014241365 A | 12/2014 | |
| JP | 2015028651 A | 2/2015 | |
| JP | H08026767 A | 1/2016 | |
| JP | 2018200912 A | 12/2018 | |
| JP | 2021145131 A | 9/2021 | |
| KR | 1020050000923 | 1/2005 | |
| KR | 100941691 B1 | 2/2010 | |
| KR | 101167691 B1 | 7/2012 | |
| KR | 101519760 | 5/2015 | |
| WO | 2007088058 A1 | 8/2007 | |
| WO | 2008119080 A1 | 10/2008 | |
| WO | 2008154931 A1 | 12/2008 | |
| WO | 2009029733 A2 | 3/2009 | |
| WO | 2009062011 A1 | 5/2009 | |
| WO | 2009126649 A2 | 10/2009 | |
| WO | 2010011939 A2 | 1/2010 | |
| WO | 2011100445 A1 | 8/2011 | |
| WO | 2011109648 A1 | 9/2011 | |
| WO | 2012078213 A1 | 6/2012 | |
| WO | 2014062226 A1 | 1/2014 | |
| WO | 2014043267 A1 | 3/2014 | |
| WO | 2014062311 A1 | 4/2014 | |
| WO | 2015108648 A1 | 7/2015 | |
| WO | 2015112903 A1 | 7/2015 | |
| WO | 2015171597 A1 | 11/2015 | |
| WO | WO-2015171597 A1 * | 11/2015 | ......... C03C 10/0009 |
| WO | 2017132280 A2 | 8/2017 | |

(56) References Cited

FOREIGN PATENT DOCUMENTS

| WO | 2017147511 A1 | 8/2017 |
|---|---|---|
| WO | 2017177171 A1 | 10/2017 |
| WO | 2018200804 A1 | 1/2018 |
| WO | 2019010045 A1 | 1/2019 |
| WO | 2019118761 A1 | 6/2019 |
| WO | 2019136024 A1 | 7/2019 |
| WO | 2019199470 A1 | 10/2019 |
| WO | 2019231947 A1 | 12/2019 |

OTHER PUBLICATIONS

International Search Report and Written Opinion for PCT/US2021/21371 dated May 20, 2021 by the USPTO, 10 pp.
European Search Report and Supplemental European Search Report for EP 19784673.6 dated Feb. 2, 2021, 8 op.
European Search Report and Supplemental European Search Report for EP 19811031.4 dated Feb. 26, 2021, 7 pp.
Grine, F. et al., "High-Q Substrate Integrated Waveguide Resonator Filter With Dielectric Loading," IEEE Access vol. 5, Jul. 12, 2017, pp. 12526-12532.
Hyeon, I-J, et al., "Millimeter-Wave Substrate Integrated Waveguide Using Micromachined Tungsten-Coated Through Glass Silicon via Structures," Micromachines, vol. 9, 172 Apr. 9, 2018, 9 pp.
International Search Report and Written Opinion for PCT/US2020/026673 dated Jun. 22, 2020, by the USPTO, 13 pp.
Mohamedelhassan, A., "Fabrication of Ridge Waveguides in Lithium Niobate," Independent thesis Advanced level, KTH, School of Engineering Sciences, Physics, 2012, 68 pp.
Muharram, B., Thesis from University of Calgary Graduate Studies, "Substrate-Integrated Waveguide Based Antenna in Remote Respiratory Sensing," 2012, 97 pp.
International Search Report and Written Opinion for PCT/US2020/28474 dated Jul. 17, 2020 by the USPTO, 7 pp.
Aslan, et al, "Metal-Enhanced Fluorescence: an emerging tool in biotechnology" Current opinion in Biotechnology (2005), 16:55-62.
Azad, I., et al., "Design and Performance Analysis of 2.45 GHz Microwave Bandpass Filter with Reduced Harmonics," International Journal of Engineering Research and Development (2013), 5(11):57-67.
Bakir, Muhannad S., et al., "Revolutionary Nanosilicon Ancillary Technologies for Ultimate-Performance Gigascale Systems," IEEE 2007 Custom Integrated Circuits Conference (CICC), 2007, pp. 421-428.
Beke, S., et al., "Fabrication of Transparent and Conductive Microdevices," Journal of Laser Micro/Nanoengineering (2012), 7(1):28-32.
Brusberg, et al. "Thin Glass Based Packaging Technologies for Optoelectronic Modules" Electronic Components and Technology Conference, May 26-29, 2009, pp. 207-212, DOI:10.1109/ECTC.2009.5074018, pp. 208-211 Figures 3, 8.
Cheng, et al. "Three-dimensional Femtosecond Laser Integration in Glasses" The Review of Laser Engineering, vol. 36, 2008, pp. 1206-1209, Section 2, Subsection 3.1.
Chowdhury, et al, "Metal-Enhanced Chemiluminescence", J Fluorescence (2006), 16:295-299.
Crawford, Gregory P., "Flexible Flat Panel Display Technology," John Wiley and Sons, NY, (2005), 9 pages.
European Search Report and Supplemental European Search Report for EP 18889385.3 dated Dec. 2, 2020, 8 pp.
European Search Report and Supplemental European Search Report for EP 188 98912.3 dated Feb. 2, 2021, 10 pp.
Green, S., "Heterogeneous Integration of DARPA: Pathfinding and Progress in Assembly Approaches," viewed on and retrieved from the Internet on Feb. 26, 2021, <URL:https://web.archive.org/web/20181008153224/https://www.ectc.net/files/68/Demmin%20Darpa.pdf>, published Oct. 8, 2018 per the Wayback Machine.
International Search Report and Written Opinion for PCT/US2020/54394 dated Jan. 7, 2021 by the USPTO, 15 pp.
Extended European Search Report for EP 19906040.1 dated Feb. 4, 2022, 16 pp.
Extended European Search Report for EP 20792242.8 dated May 3, 2022, 10 pp.
Kim, Dongsu, et al., "A Compact and Low-profile GaN Power Amplifier Using Interposer-based MMCI Technology," 2014 IEEE 16th Electronics Packaging Technology Conference, pp. 672-675.
Optics 101, "What is a Halogen Lamp?", Apr. 25, 2014, p. 1-2.
Dang, et al. "Integrated thermal-fluidic I/O interconnects for an on-chip microchannel heat sink," IEEE Electron Device Letters, vol. 27, No. 2, pp. 117-119, 2006.
Dietrich, T.R., et al., "Fabrication Technologies for Microsystems Utilizing Photoetchable Glass," Microelectronic Engineering 30, (1996), pp. 407-504.
Extended European Search Report 15741032.5 dated Aug. 4, 2017, 11 pp.
Extended European Search Report 15789595.4 dated Mar. 31, 2017, 7 pp.
Extended European Search Report 17744848.7 dated Oct. 30, 2019, 9 pp.
Extended European Search Report 17757365.6 dated Oct. 14, 2019, 14 pp.
Geddes, et al., "Metal-Enhanced Fluorescence" J Fluorescence, (2002), 12:121-129.
Gomez-Morilla, et al. "Micropatterning of Foturan photosensitive glass following exposure to MeV proton beams" Journal of Micromechanics and Microengineering, vol. 15, 2005, pp. 706-709, DOI:10.1088/0960-1317/15/4/006.
Intel Corporation, "Intel® 82566 Layout Checklist (version 1.0)", 2006.
International Search Report and Written Opinion for PCT/US2008/058783 dated Jul. 1, 2008, 15 pp.
International Search Report and Written Opinion for PCT/US2008/074699 dated Feb. 26, 2009, 11 pp.
International Search Report and Written Opinion for PCT/US2009/039807 dated Nov. 24, 2009, 13 pp.
International Search Report and Written Opinion for PCT/US2009/051711 dated Mar. 5, 2010, 15 pp.
International Search Report and Written Opinion for PCT/US2011/024369 dated Mar. 25, 2011, 13 pp.
International Search Report and Written Opinion for PCT/US2013/059305 dated Jan. 10, 2014, 6 pp.
International Search Report and Written Opinion for PCT/US2015/012758 dated Apr. 8, 2015, 11 pp.
International Search Report and Written Opinion for PCT/US2015/029222 dated Jul. 22, 2015, 9 pp.
International Search Report and Written Opinion for PCT/US2017/019483 dated May 19, 2017, 11 pp.
International Search Report and Written Opinion for PCT/US2017/026662 dated Jun. 5, 2017, 11 pp.
International Search Report and Written Opinion for PCT/US2018/029559 dated Aug. 3, 2018, 9 pp.
International Search Report and Written Opinion for PCT/US2018/039841 dated Sep. 20, 2018 by Australian Patent Office, 12 pp.
International Search Report and Written Opinion for PCT/US2018/065520 dated Mar. 20, 2019 by Australian Patent Office, 11 pp.
International Search Report and Written Opinion for PCT/US2018/068184 dated Mar. 19, 2019 by Australian Patent Office, 11 pp.
International Search Report and Written Opinion for PCT/US2019/024496 dated Jun. 20, 2019 by Australian Patent Office, 9 pp.
International Search Report and Written Opinion for PCT/US2019/34245 dated Aug. 9, 2019 by Australian Patent Office, 10 pp.
International Search Report and Written Opinion for PCT/US2019/50644 dated Dec. 4, 2019 by USPTO, 9 pp.
International Technology Roadmap for Semiconductors, 2007 Edition, "Assembly and Packaging," 9 pages.
Kamagaing, et al., "Investigation of a photodefinable glass substrate for millimeter-wave radios on package," Proceeds of the 2014 IEEE 64th Electronic Components and Technology Conference, May 27, 2014, pp. 1610-1615.
Lakowicz, et al; "Advances in Surface-Enhanced Fluorescence", J Fluorescence, (2004), 14:425-441.

(56) References Cited

OTHER PUBLICATIONS

Lewis, Sr., "Hawley's Condensed Chemical Dictionary." 13th ed, 1997, John Wiley and Sons. p. 231.
Lin, C.H., et al., "Fabrication of Microlens Arrays in Photosensitive Glass by Femtosecond Laser Direct Writing," Appl Phys A (2009) 97:751-757.
Livingston, F.E., et al., "Effect of Laser Parameters on the Exposure and Selective Etch Rate in Photostructurable Glass," SPIE vol. 4637 (2002); pp. 404-412.
Lyon, L.A., et al., "Raman Spectroscopy," Anal Chem (1998), 70:341R-361R.
Papapolymerou, I., et al., "Micromachined patch antennas," IEEE Transactions on Antennas and Propagation, vol. 46, No. 2, 1998, pp. 275-283.
Perro, A., et al., "Design and synthesis of Janus micro- and nanoparticles," J Mater Chem (2005), 15:3745-3760.
Quantum Leap, "Liquid Crystal Polymer (LCP) LDMOS Packages," Quantum Leap Datasheet, (2004), mlconnelly.com/QLPKG.Final_LDMOS_DataSheet.pdf, 2 pages.
Scrantom, Charles Q., "LTCC Technology—Where We Are and Where We're Going—IV," Jun. 2000, 12 pages.
TechNote #104, Bangs Laboratories, www.bangslabs.com/technotes/104.pdf, "Silica Microspheres".
TechNote #201, Bangs Laboratories, www.bangslabs.com/technotes/201.pdf, "Working with Microspheres".
TechNote #205, Bangs Laboratories, www.bangslabs.com/technotes/205.pdf, "Covalent Coupling".
Wang, et al. "Optical waveguide fabrication and integration with a micro-mirror inside photosensitive glass by femtosecond laser direct writing" Applied Physics A, vol. 88, 2007, pp. 699-704, DOI:10.1007/S00339-007-4030-9.
Zhang, H., et al., "Biofunctionalized Nanoarrays of Inorganic Structures Prepared by Dip-Pen Nanolithography," Nanotechnology (2003), 14:1113-1117.
Zhang, H., et al., Synthesis of Hierarchically Porous Silica and Metal Oxide Beads Using Emulsion-Templated Polymer Scaffolds, Chem Mater (2004), 16:4245-4256.
Chou, et al., "Design and Demonstration of Micro-mirrors and Lenses for Low Loss and Low Cost Single-Mode Fiber Coupling in 3D Glass Photonic Interposers," 2016 IEEE 66th Electronic Components and Technology Conference, May 31-Jun. 3, 7 pp.
European Search Report and Supplemental European Search Report for EP 18828907 dated Mar. 25, 2020, 11 pp.
International Search Report and Written Opinion for PCT/US2019/068586 dated Mar. 12, 2020 by USPTO, 10 pp.
International Search Report and Written Opinion for PCT/US2019/068590 dated Mar. 5, 2020 by USPTO, 9 pp.
International Search Report and Written Opinion for PCT/US2019/068593 dated Mar. 16, 2020 by USPTO, 8 pp.
Topper, et al., "Development of a high density glass interposer based on wafer level packaging technologies," 2014 IEEE 64th Electronic Components and Technology Conference, May 27, 2014, pp. 1498-1503.
International Search Report and Written Opinion for PCT/US2021/27499 dated Jun. 16, 2021 by the USPTO, 7 pp.
European Search Report and Supplemental European Search Report for EP 19861556.9 dated Jan. 18, 2022, 9 pp.
European Search Report and Supplemental European Search Report for EP 19905255.6 dated Jul. 26, 2022, 8 pp.
European Search Report and Supplemental European Search Report for EP 19905255.6 dated Aug. 4, 2022, 8 pp.
European Search Report and Supplemental European Search Report for EP 20783596.8 dated Oct. 26, 2022, 13 pp.
European Search Report and Supplemental European Search Report for EP 20877664.1 dated Oct. 28, 2022, 10 pp.
Flemming, J.H., et al., "Cost Effective 3D Glass Microfabrication for Advanced RF Packages," Microwave Journal, Apr. 14, 2014, 12 pp.
Foster, T., "High-Q RF Devices in APEX Glass," Jun. 21, 2018, https://nanopdf.com/download/high-q-rf-devices-in-apex-glass_pdf, retrieved on Oct. 3, 2022, 8 pp.
International Search Report and Written Opinion for PCT/US2022/31993 dated Sep. 9, 2022 by the USPTO, 9 pp.
International Search Report and Written Opinion for PCT/US2022/29442 dated Oct. 6, 2022 by the USPTO, 20 pp.

* cited by examiner

IMPEDENCE MATCHING CONDUCTIVE STRUCTURE FOR HIGH EFFICIENCY RF CIRCUITS

CROSS-REFERENCE TO RELATED APPLICATIONS

This application is the National Stage of International Application No. PCT/US2018/068184, filed on Dec. 31, 2018 claiming the priority to U.S. Provisional Application No. 62/613,735 filed on Jan. 4, 2018, the contents of each of which are incorporated by reference herein.

TECHNICAL FIELD OF THE INVENTION

The present invention relates to creating impedance matching between RF devices on the same substrate.

BACKGROUND OF THE INVENTION

Without limiting the scope of the invention, its background is described in connection with impedance matching.

One such example is taught in U.S. Pat. No. 9,819,991, issued to Rajagopalan, et al., entitled "Adaptive impedance matching interface". These inventors are said to teach a device that includes a data interface connector, an application processor, and interface circuitry. Interface circuitry is said to be coupled between the application processor and the data interface connector, in which the data interface circuitry determines a change in a signal property of one of the signals, the change being caused by an impedance mismatch between the data interface connector and a media consumption device. The application processor is said to adjust the signal property of a subsequent one of the signals, in response to the signal property setting from the interface circuitry, to obtain an adjusted signal, or can send the adjusted signal to the media consumption device.

Another such example is taught in U.S. Pat. No. 9,755,305, issued to Desclos, et al., and entitled "Active antenna adapted for impedance matching and band switching using a shared component". Briefly, these inventors are said to teach an active antenna and associated circuit topology that is adapted to provide active impedance matching and band switching of the antenna using a shared tunable component, e.g., using a shared tunable component, such as a tunable capacitor or other tunable component. The antenna is said to provide a low cost and effective active antenna solution, e.g., one or more passive components can be further utilized to design band switching of the antenna from a first frequency to a second desired frequency.

However, despite these advances, a need remains for impedance matching between RF devices on the same substrate.

SUMMARY OF THE INVENTION

In one embodiment, the present invention includes a method of making an RF impedance matching device comprising: masking a design layout comprising one or more structures to form one or more angled electrical conduction channels on a photosensitive glass substrate; exposing at least one portion of the photosensitive glass substrate to an activating energy source; heating the photosensitive glass substrate for at least ten minutes above its glass transition temperature; cooling the photosensitive glass substrate to transform at least part of the exposed glass to a crystalline material to form a glass-crystalline substrate; etching the glass-crystalline substrate with an etchant solution to form the angled electrical conduction channels of the device; coating the one or more angled electrical conduction channels with one or more metals; and coating all or part of the electrical isolation structure with a metallic media, wherein the metal is connected to a circuitry. In one aspect, the RF impedance matching device has mechanical support under less than 50% of the length or width of the RF impedance matching device. In another aspect, the height of the mechanical support is greater than 10 μm reducing the RF loses. In another aspect, the lateral distance between RF impedance matching device and the substrate is greater than 10 μm reducing the RF loses. In another aspect, the step of etching forms an air gap between the substrate and the RF impedance matching device, wherein the RF impedance matching device is connected to other RF electronic elements. In another aspect, the glass-crystalline substrate adjacent to the trenches may also be converted to a ceramic phase. In another aspect, a conductive structure other than a ground plane of the RF impedance matching device that can be at least one of a microstrip, a stripline, a coplanar wave guide, a grounded coplanar wave guide, or a coaxial waveguide. In another aspect, the one or more metals are selected from Fe, Cu, Au, Ni, In, Ag, Pt, or Pd. In another aspect, the metal is connected to the circuitry through a surface a buried contact, a blind via, a glass via, a straight line contact, a rectangular contact, a polygonal contact, or a circular contact. In another aspect, the photosensitive glass substrate is a glass substrate comprising a composition of: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Al_2O$; 0.003-2 weight % $Cu_2O$; 0.75 weight %-7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$. In another aspect, the photosensitive glass substrate is a glass substrate comprising a composition of: 35-76 weight % silica, 3-16 weight % ($K_2O$, 0.003-1 weight % $Ag_2O$, 0.75-13 weight % $B_2O_3$, 8-15 weight % $Li_2O$, and 0.001-0.1 weight % $CeO_2$. In another aspect, the photosensitive glass substrate is at least one of: a photo-definable glass substrate comprises at least 0.3 weight % $Sb_2O_3$ or $As_2O_3$; a photo-definable glass substrate comprises 0.003-1 weight % $Au_2O$; a photo-definable glass substrate comprises 1-18 weight % of an oxide selected from the group consisting of CaO, ZnO, PbO, MgO and BaO; and optionally has an anisotropic-etch ratio of exposed portion to said unexposed portion is at least one of 10-20:1; 21-29:1; 30-45:1; 20-40:1; 41-45:1; and 30-50:1. In another aspect, the photosensitive glass substrate is a photosensitive glass ceramic composite substrate comprising at least silica, lithium oxide, aluminum oxide, and cerium oxide. In another aspect, the RF impedance matching device has a loss of less than 50, 40, 30, 25, 20, 15, or 10% of the signal input versus an signal output. In another aspect, the method further comprises forming the RF impedance matching device into a feature of at least one of a Time Delay Network, a Directional Couplers Biased Tee, a Fixed Coupler, a Phase Array Antenna, a Filters and Duplexer, a Balun, a Power Combiners/Dividers, or a Power Amplifiers, at frequencies from MHz to THz.

In another embodiment, the present invention includes a method of making a conductive structure for an RF impedance matching device comprising: masking a design layout comprising one or more conductive structures to form one or more angled electrical conduction channels on the photosensitive glass substrate; exposing at least one portion of the photosensitive glass substrate to an activating energy source; processing the photosensitive glass substrate to a heating phase of at least ten minutes above its glass transition temperature; cooling the photosensitive glass substrate to transform at least part of the exposed glass to a crystalline material to form a glass-crystalline substrate; etching the glass-crystalline substrate with an etchant solution to form the one or more angled electrical conduction channels in the device, wherein the glass-crystalline substrate adjacent to the trenches may also be converted to a ceramic phase, and wherein the RF impedance matching device that has mechanical support by less than 50% of the length or width of the RF impedance matching device by the photosensitive glass substrate; coating the one or more angled electrical conduction channels with one or more metals; and coating all or part of the electrical isolation structure with a metallic media, wherein the metal is connected to a circuitry through a surface or buried contact. In one aspect, the one or more conductive structures that include at least one of: a microstrip, a stripline, a coplanar wave guide, a grounded coplanar wave guide, or a coaxial waveguide. In another aspect, the height of the mechanical support is greater than 10 µm reducing the RF loses. In another aspect, the lateral distance between the transmission line and the substrate is greater than 10 µm reducing the RF loses. In another aspect, the step of etching forms an air gap between the substrate and the RF impedance matching device, wherein the transmission line is connected to other RF electronic elements. In another aspect, the one or more metals are selected from Fe, Cu, Au, Ni, In, Ag, Pt, or Pd. In another aspect, the photosensitive glass substrate is a glass substrate comprising a composition of: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O$; with the combination of $B_2O_3$; and $Al_2O_3$ not exceeding 13 weight %; 8-15 weight % $Li_2O$; and 0.001-0.1 weight % $CeO_2$. In another aspect, the photosensitive glass substrate is a glass substrate comprising a composition of: 35-76 weight % silica, 3-16 weight % $K_2O$, 0.003-1 weight % $Ag_2O$, 0.75-13 weight % $B_2O_3$, 8-15 weight % $Li_2O$, and 0.001-0.1 weight % $CeO_2$. In another aspect, the photosensitive glass substrate is at least one of: a photo-definable glass substrate comprises at least 0.3 weight % $Sb_2O_3$ or $As_2O_3$; a photo-definable glass substrate comprises 0.003-1 weight % $Au_2O$; a photo-definable glass substrate comprises 1-18 weight % of an oxide selected from the group consisting of CaO, ZnO, PbO, MgO and BaO; and optionally has an anisotropic-etch ratio of exposed portion to said unexposed portion is at least one of 10-20:1; 21-29:1; 30-45:1; 20-40:1; 41-45:1; and 30-50:1. In another aspect, the photosensitive glass substrate is a photosensitive glass ceramic composite substrate comprising at least silica, lithium oxide, aluminum oxide, and cerium oxide. In another aspect, the RF impedance matching device has a loss of less than 50, 40, 30, 25, 20, 15, or 10% of the signal input versus an signal output. In another aspect, the method further comprises forming the RF impedance matching device into a feature of at least one of a Time Delay Network, a Directional Couplers Biased Tee, a Fixed Coupler, a Phase Array Antenna, a Filters and Duplexer, a Balun, a Power Combiners/Dividers, or a Power Amplifiers, at frequencies from MHz to THz.

In another embodiment, the present invention includes an RF impedance matching device is mechanically support by less than 50% of the length or width of the RF impedance matching device formed on a photo-definable glass the substrate. In one aspect, the RF impedance matching device comprises one or more angled electrical conduction channels on the photosensitive glass substrate. In another aspect, the RF impedance matching device has mechanical support under less than 50% of the length or width of the RF RF impedance matching device. In another aspect, the height of the mechanical support is greater than 10 µm reducing the RF loses. In another aspect, the lateral distance between the transmission line and the substrate is greater than 10 µm reducing the RF loses. In another aspect, the air gap transmission is connected to other RF electronic elements. In another aspect, the glass-crystalline substrate adjacent to the trenches may also be converted to a ceramic phase. In another aspect, the one or more metals are selected from Fe, Cu, Au, Ni, In, Ag, Pt, or Pd. In another aspect, the metal is connected to the circuitry through a surface a buried contact, a blind via, a glass via, a straight line contact, a rectangular contact, a polygonal contact, or a circular contact. In another aspect, the RF impedance matching device comprises a feature of at least one of a Time Delay Network, a Directional Couplers Biased Tee, a Fixed Coupler, a Phase Array Antenna, a Filters and Duplexer, a Balun, a Power Combiners/Dividers, or a Power Amplifiers, at frequencies from MHz to THz. In another aspect, the RF impedance matching device comprises one or more conductive structures that include at least one of: a microstrip, a stripline, a coplanar wave guide, a grounded coplanar wave guide, or a coaxial waveguide.

BRIEF DESCRIPTION OF THE DRAWINGS

For a more complete understanding of the features and advantages of the present invention, reference is now made to the detailed description of the invention along with the accompanying figures and in which:

FIG. 2E-1 shows a top view of the etch the exposed photodefinable glass in 10% HF solution down copper/metal ground plane, and FIG. 2E-2 shows a side view of the same device shown in FIG. 2E-1.

FIG. 2F-1 shows a top view of the fill the etched region with a low loss tangent material that is a different dielectric constant than the APEX Glass, and FIG. 2F-2 shows a side view of the same device shown in FIG. 2F-1.

DETAILED DESCRIPTION OF THE INVENTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not limit the invention, except as outlined in the claims.

The present invention relates to creating an impedance matching between RF device on the same substrate. Devices such as Filters, Inductors, Capacitors Resistors, Time Delay Networks, Directional Couplers Biased Tees, Fixed Couplers, Phase Array Antenna, Filters & Diplexers, Baluns, Power Combiners/Dividers and Power Amplifiers have different impedance. These devices are often connected by a conductive structure. The conductive structure can be comprised of a microstrip, stripline, coplanar wave guide, grounded coplanar wave guide, and coaxial waveguide. We convenience and brevity will refer to all of these potential conductive structures as a microstrip line. When an RF signal is transmitted between different devices on a microstrip line the impedance difference can create losses or reflected signals. Creating an impedance matching structure reduces losses, improves signal quality (increasing data rates and transmission distance), reduces losses and improves battery life.

Photosensitive glass structures have been suggested for a number of micromachining and microfabrication processes such as integrated electronic elements in conjunction with other elements systems or subsystems. Semiconductor microfabrication using thin film additive processes on semiconductor, insulating or conductive substrates is expensive with low yield and a high variability in performance. An example of additive micro-transmission can be seen in articles Semiconductor microfabrication processes by Tian et al. rely on expensive capital equipment; photolithography and reactive ion etching or ion beam milling tools that generally cost in excess of one million dollars each and require an ultra-clean, high-production silicon fabrication facility costing millions to billions more. This invention provides creates a cost effective glass ceramic electronic individual device or as an array of devices with a uniform response across a large broadband low loss transmission structure.

Microstrip transmission lines consist of a conductive strip of width "W" and thickness "t" and a wider ground plane, separated by a dielectric layer (a.k.a. the "substrate") of thickness "H" as shown in the figure below. Microstrip is by far the most popular microwave transmission line, especially for microwave integrated circuits and MMICs. The major advantage of microstrip over stripline is that all active components can be mounted on top of the board. The disadvantages are that when high isolation is required such as in a filter or switch, some external shielding may have to be considered. Given the chance, microstrip circuits can radiate, causing unintended circuit response. A minor issue with microstrip is that it is dispersive, meaning that signals of different frequencies travel at slightly different speeds. Microstrip does not support a TEM mode, because of its filling factor. For coupled lines, the even and odd modes will not have the same phase velocity. This property is what causes the asymmetric frequency of microstrip bandpass filters, for example.

Figure 1A:
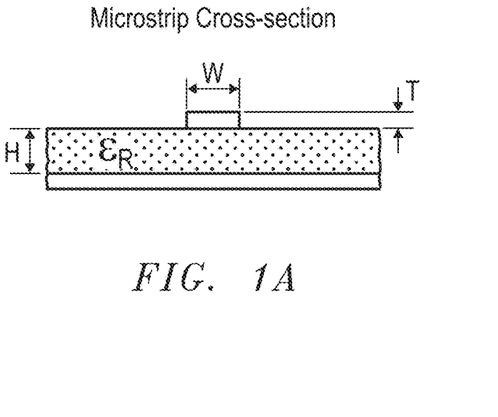
FIGS. 1A and 1B show two variants of microstrip which includes embedded microstrip and coated microstrip, both of which add some dielectric above the microstrip conductor.
Figure 1B:
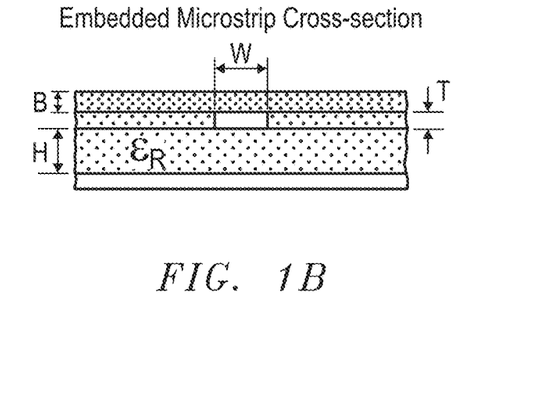

Microstrip. FIGS. 1A and 1B shows two variants of microstrip include embedded microstrip and coated microstrip, both of which add some dielectric above the microstrip conductor.

Effective dielectric constant. Because part of the fields from the microstrip conductor exist in air, the effective dielectric constant "Keff" is somewhat less than the substrate's dielectric constant (also known as the relative permittivity). The effective dielectric constant $\epsilon_{eff}$ of microstrip is calculated by:

$$\text{when } \left(\frac{W}{H}\right) < 1 \frac{W}{H}$$

$$\varepsilon_e = \frac{\varepsilon_r + 1}{2} + \frac{\varepsilon_r - 1}{2}\left[\left(1 + 12\left(\frac{H}{W}\right)\right)^{-\frac{1}{2}} + 0.04\left(1 - \left(\frac{W}{H}\right)\right)^2\right]$$

$$\text{when } \left(\frac{W}{H}\right) \geq 1$$

$$\varepsilon_e = \frac{\varepsilon_r + 1}{2} + \frac{\varepsilon_r - 1}{2}\left(1 + 12\left(\frac{H}{W}\right)\right)^{-\frac{1}{2}}$$

The effective dielectric constant is a seen to be a function of the ratio of the width to the microstrip line to the height of substrate (W/H), as well as the dielectric constant of the substrate material.

Characteristic impedance. Characteristic impedance $Z_0$ of microstrip is also a function of the ratio of the height to the width W/H (and ratio of width to height H/W) of the transmission line, and also has separate solutions depending on the value of W/H. The characteristic impedance $Z_0$ of microstrip is calculated by:

$$\text{when } \left(\frac{W}{H}\right) < 1$$

-continued $$Z_0 = \frac{60}{\sqrt{\varepsilon_{eff}}} \ln\left(8\frac{H}{W} + 0.25\frac{W}{H}\right) \text{(ohms)}$$

when $\left(\frac{W}{H}\right) \geq 1$

$$Z_0 = \frac{120\pi}{\sqrt{\varepsilon_{eff}} \times \left[\frac{W}{H} + 1.393 + \frac{2}{3}\ln\left(\frac{W}{H} + 1.444\right)\right]} \text{(ohms)}$$

Impedance matched RF circuit requires optimizing the:
a. Thickness of the substrate H bellow the mircrostrip line;
b. Dielectric constant of the substrate bellow the mircrostrip line; and
c. Width of the mircrostrip line.

The present invention includes a method to fabricate a substrate with RF impedance matching device structures RF devices on a photodefinable glass ceramic substrate. In general the impedance matching device is formed by etching a triangular via through the photodefinable glass ceramic, then filling the with a non conductive media with a different dielectric constant that is different from the photodefinable glass ceramic substrate. The metal line that connects the RF devices transverses the length of the filled triangular shaped region from the narrow to wide end.

To address these needs, the present inventors developed a glass ceramic (APEX® Glass ceramic) as a novel packaging and substrate material for semiconductors, RF electronics, microwave electronics, and optical imaging. APEX® Glass ceramic is processed using first generation semiconductor equipment in a simple three step process and the final material can be fashioned into either glass, ceramic, or contain regions of both glass and ceramic. Photo-etchable glasses have several advantages for the fabrication of a wide variety of microsystems components.

Microstructures have been produced relatively inexpensively with these glasses using conventional semiconductor processing equipment. In general, glasses have high temperature stability, good mechanical and electrically properties, and have better chemical resistance than plastics and many metals. Photoetchable glass is comprised of lithium-aluminum-silicate glass containing traces of silver ions. When exposed to UV-light within the absorption band of cerium oxide, the cerium oxide acts as sensitizers, absorbing a photon and losing an electron that reduces neighboring silver oxide to form silver atoms, e.g., $Ce^{3+}+Ag^+=Ce^{4+}+Ag^0$ The silver atoms coalesce into silver nanoclusters during the baking process and induce nucleation sites for crystallization of the surrounding glass. If exposed to UV light through a mask, only the exposed regions of the glass will crystallize during subsequent heat treatment.

This heat treatment must be performed at a temperature near the glass transformation temperature (e.g., greater than 465° C. in air). The crystalline phase is more soluble in etchants, such as hydrofluoric acid (HF), than the unexposed vitreous, amorphous regions. The crystalline regions etched greater than 20 times faster than the amorphous regions in 10% HF, enabling microstructures with wall slopes ratios of about 20:1 when the exposed regions are removed. See T. R. Dietrich et al., "Fabrication technologies for microsystems utilizing photoetchable glass," Microelectronic Engineering 30, 497 (1996), which is incorporated herein by reference.

In general photoetchable glass and is composed of silicon oxide ($SiO_2$) of 75-85% by weight, lithium oxide ($Li_2O$) of 7-11% by weight, aluminum oxide ($Al_2O_3$) of 3-6% by weight, sodium oxide ($Na_2O$) of 1-2% by weight, 0.2-0.5% by weight antimonium trioxide ($Sb_2O_3$) or arsenic oxide ($As_2O_3$), silver oxide ($Ag_2O$) of 0.05-0.15% by weight, and cerium oxide ($CeO_2$) of 0.01-0.04% by weight. As used herein the terms "APEX® Glass ceramic", "APEX glass" or simply "APEX" is used to denote one embodiment of the glass ceramic composition of the present invention.

APEX composition provides three main mechanisms for its enhanced performance: (1) The higher amount of silver leads to the formation of smaller ceramic crystals which are etched faster at the grain boundaries, (2) the decrease in silica content (the main constituent etched by the HF acid) decreases the undesired etching of unexposed material, and (3) the higher total weight percent of the alkali metals and boron oxide produces a much more homogeneous glass during manufacturing.

The present invention includes a method for fabricating a low loss RF impedance matching structure in APEX Glass structure for use in forming angled structures, mirrors and glass ceramic materials used in electromagnetic transmission and filtering applications. The present invention includes an angled structure created in the multiple planes of a glass-ceramic substrate, such process employing the (a) exposure to excitation energy such that the exposure occurs at various angles by either altering the orientation of the substrate or of the energy source, (b) a bake step and (c) an etch step. Angle sizes can be either acute or obtuse. The curved and digital structures are difficult, if not infeasible to create in most glass, ceramic or silicon substrates. The present invention has created the capability to create such structures in both the vertical as well as horizontal plane for glass-ceramic substrates.

Ceramicization of the glass is accomplished by exposing a region of the APEX Glass substrate to approximately 20 $J/cm^2$ of 310 nm light. In one embodiment, the present invention provides a quartz/chrome mask containing a variety of concentric circles with different diameters.

The present invention includes a method for fabricating a RF impedance matching microstrip line used to connect different electronic devices fabricated in or attached to the photosensitive glass. The RF impedance matching microstrip line can connect devices including but not limited to: Filters, Inductors, Capacitors Resistors, Time Delay Networks, Directional Couplers Biased Tees, Fixed Couplers, Phase Array Antenna, Filters & Diplexers, Baluns, Power Combiners/Dividers and Power Amplifiers. The photosensitive glass substrate can having a wide number of compositional variations including but not limited to: 60-76 weight % silica; at least 3 weight % K2O with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$. This and other varied compositions are generally referred to as the APEX glass.

The exposed portion may be transformed into a crystalline material by heating the glass substrate to a temperature near the glass transformation temperature. When etching the glass substrate in an etchant such as hydrofluoric acid, the anisotropic-etch ratio of the exposed portion to the unexposed portion is at least 30:1 when the glass is exposed to a broad spectrum mid-ultraviolet (about 308-312 nm) flood lamp to provide a shaped glass structure that have an aspect ratio of at least 30:1, and to provide a lens shaped glass structure. The mask for the exposure can be of a halftone mask that provides a continuous grey scale to the exposure to form a curved structure for the micro lens. A digital mask used with the flood exposure can be used to produce a diffractive optical element or Fresnel lens. The exposed glass is then baked typically in a two-step process. Temperature range heated between of 420° C.-520° C. for between 10 minutes to 2 hours, for the coalescing of silver ions into silver nanoparticles and temperature range heated between 520° C.-620° C. for between 10 minutes and 2 hours allowing the lithium oxide to form around the silver nanoparticles. The glass plate is then etched. The glass substrate is etched in an etchant, of HF solution, typically 5% to 10% by volume, wherein the etch ratio of exposed portion to that of the unexposed portion is at least 30:1. Create the impedance matching strip line structure requires this general processing approach.

Figure 2A:
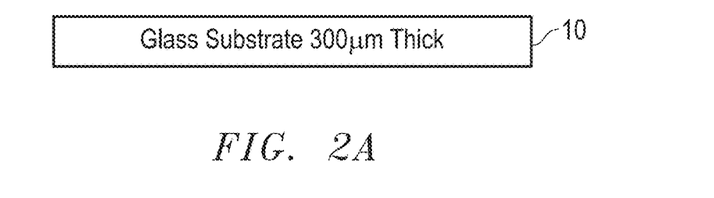
FIG. 2A shows a side view of the start of the method in which a lap and polished photodefinable glass substrate that is used, e.g., a 300 µm thick lap and polished photodefinable glass.

FIG. 2A shows a side view of the start of the method in which a lap and polished photodefinable glass substrate 10 that is used, e.g., a 300 μm thick lap and polished photodefinable glass.

Figure 2B:
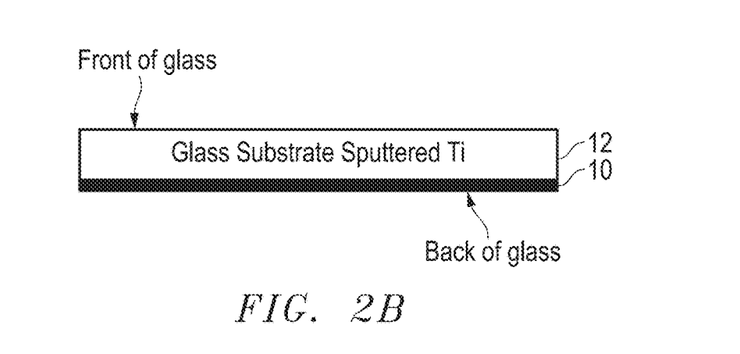
FIG. 2B shows a side view DC Sputter a uniform coating of titanium between 200 Å and 10,000 Å thick on the back of the substrate.

FIG. 2B shows a side view DC Sputter a uniform coating of titanium 12 between 200 Å and 10,000 Å thick on the back of the photodefinable glass substrate 10.

Figure 2C:
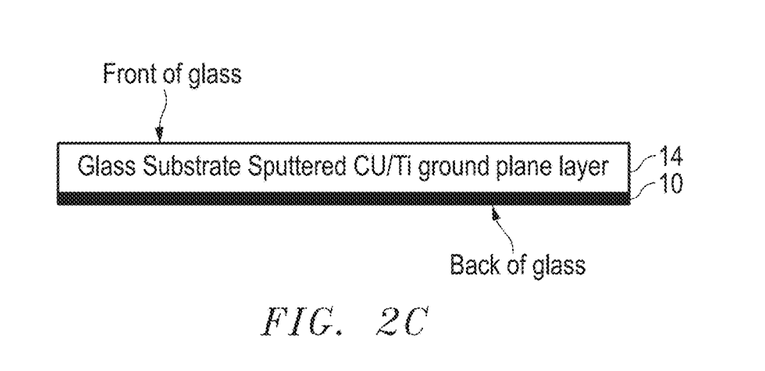
FIG. 2C shows a side view of the electroplate a copper ground plane on the back of the substrate. The copper ground plane should be between 0.5 µm and 10 µm thick on the back of the substrate.

FIG. 2C shows a side view of the electroplate a copper ground plane on the back of the substrate. The copper ground plane 14 should be between 0.5 μm and 10 μm thick on the back of the photodefinable glass substrate 10.

Figure 2D:
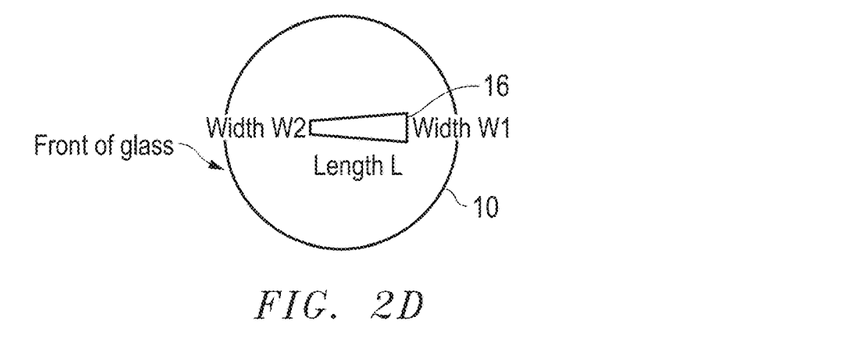
FIG. 2D shows a top view of the device formed using a chrome mask with a triangular or trapezoidal clear region to exposed the photodefinable glass substrate. The substrate is 6" in diameter. The exposure is with approximately 20 J/cm² of 310 nm light. The length L is 100 µm to 200 µm; Width W2 is 10 µm; Width W1 is 50 µm. Next, heat the exposed photodefinable glass to 450° C. for 60 min.
Figure 2E:
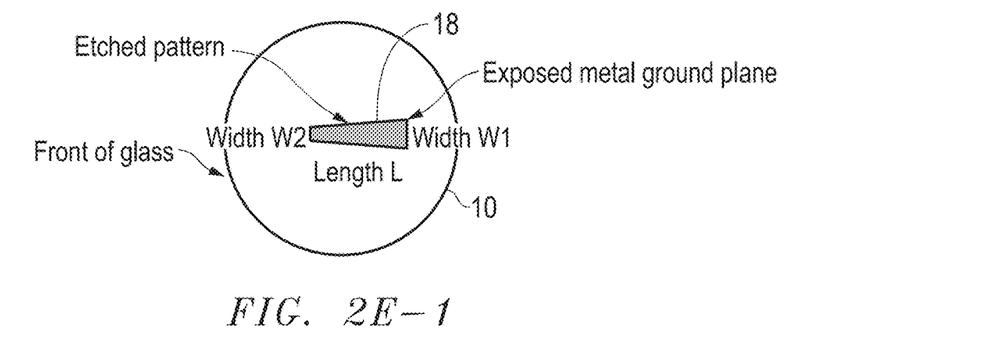
Figure 2E:
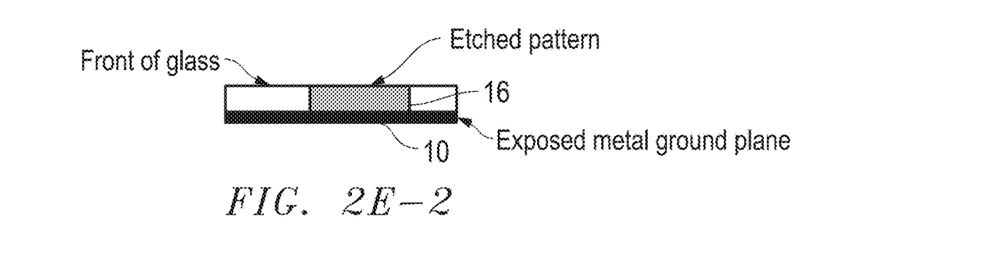
Figure 2F:
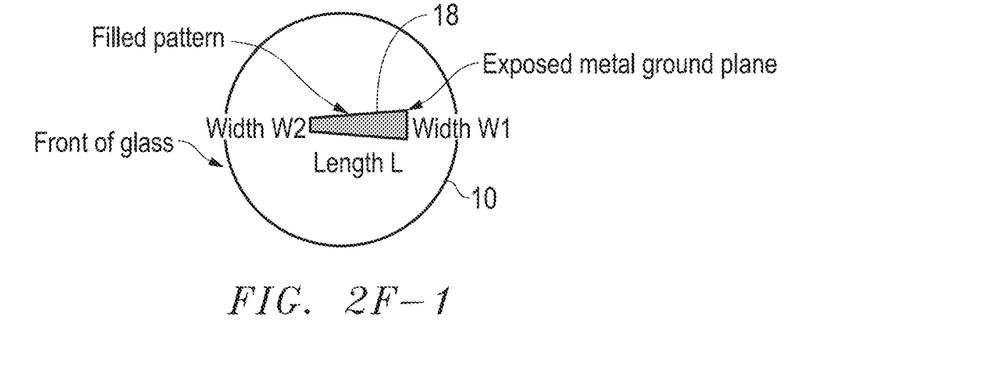
Figure 2F:
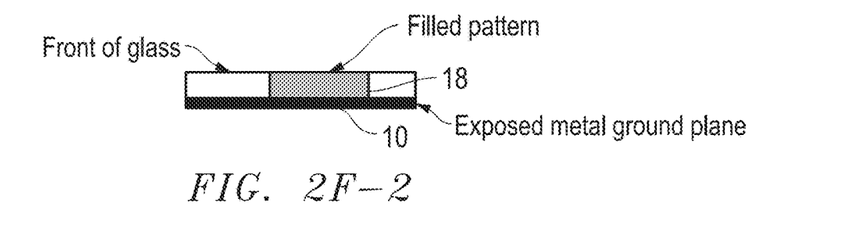

FIG. 2D shows a top view of the device formed using a chrome mask 16 with a triangular or trapezoidal clear region to exposed the photodefinable glass substrate 10. The substrate is 6" in diameter. The exposure is with approximately 20 J/cm2 of 310 nm light. The length L is 100 μm to 200 μm; Width W2 is 10 μm; Width W1 is 50 μm. Next, heat the exposed photodefinable glass to 450° C. for 60 min.

FIG. 2E-1 shows a top view of the etch the exposed photodefinable glass substrate 10 in 10% HF solution down copper/metal ground plane 18, and FIG. 2E-2 shows a side view of the same device shown in FIG. 2E-1.

FIG. 2G-1 shows a top view of the fill the etched region with a low loss tangent material that is a different dielectric constant than the APEX Glass, and FIG. 2G-2 shows a side view of the same device shown in FIG. 2G-1. For a low dielectric constant requirement the patterned structure can be filled with a spin on glass from Allied Signal (methyl siloxane spin-on-glass). For high dielectric requirements the patterned structure can be filled with, e.g., a $BaTiO_3$ paste from Advance Materials. Next, the feature is heat treated on the photodefinable glass substrate 10 to 600° C. for 1 hour.

Figure 2G:
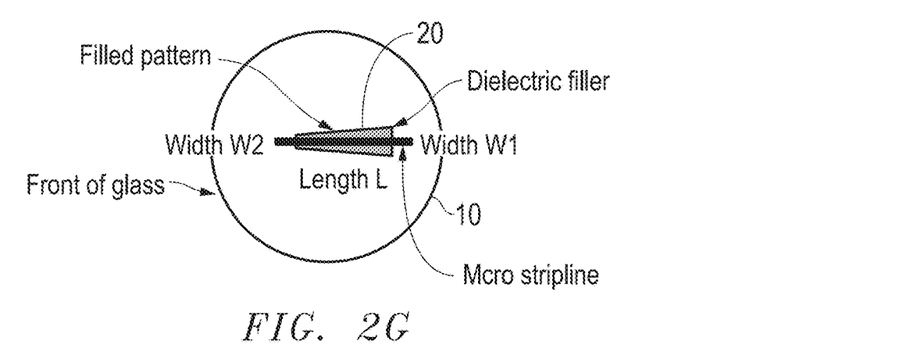
FIG. 2G shows a top view of the device after applying a photoresist and expose a pattern develop and removed the exposed pattern for the microwave stripline.

FIG. 2H shows a top view of the device after applying a photoresist 20 and expose a pattern develop and removed the exposed pattern for the microwave stripline.

Figure 2H:
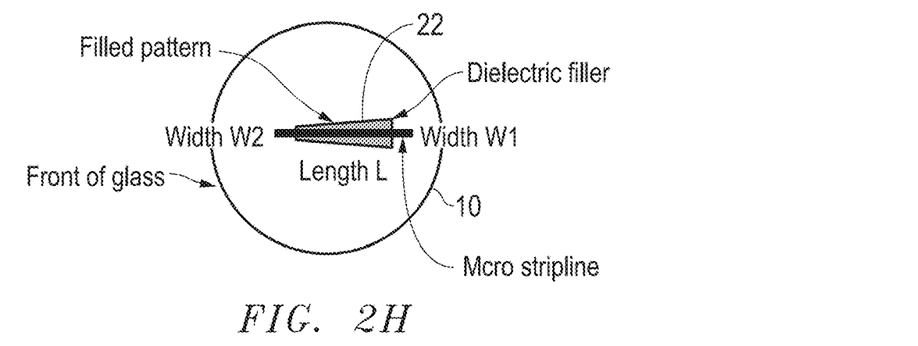
FIG. 2H shows a top view after DC Sputter a coating of titanium between 200 Å and 10,000 Å thick on the front of the substrate/photoresist.

FIG. 2I shows a top view after DC Sputter a coating of titanium 22 between 200 Å and 10,000 Å thick on the front of the substrate/photoresist 10.

Figure 2I:
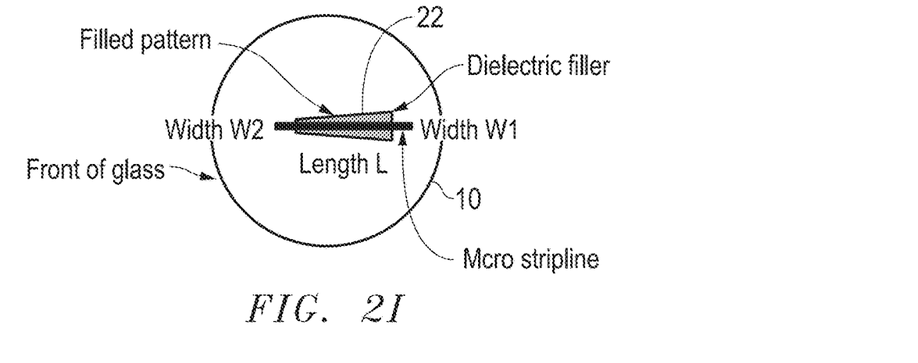
FIG. 2I is a top view after removing the photoresist using a solvent to expose a titanium pattern on the photodefinable glass substrate.

FIG. 2J is a top view after removing the photoresist using a solvent to expose a titanium pattern 24 on the photodefinable glass substrate.

Figure 2J:
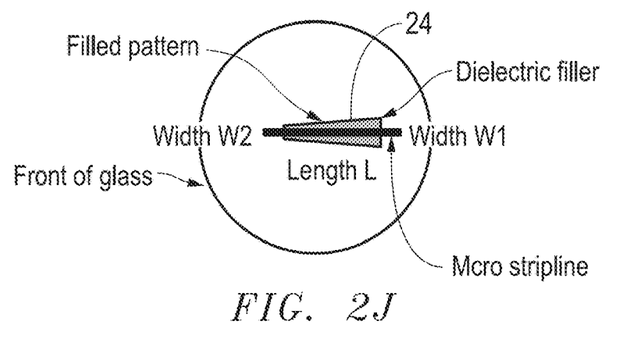
FIG. 2J is a top view after electroplating a copper in the patterned titanium. The copper should be between 0.5 µm and 10 µm thick on the back of the substrate.

FIG. 2K is a top view after electroplating a copper in the patterned titanium. The copper should be between 0.5 μm and 10 μm thick on the back of the substrate. If the application requires an air gap then the wafer is exposed to a 0.5% HF etch removing the spin on glass.

Figure 2K:
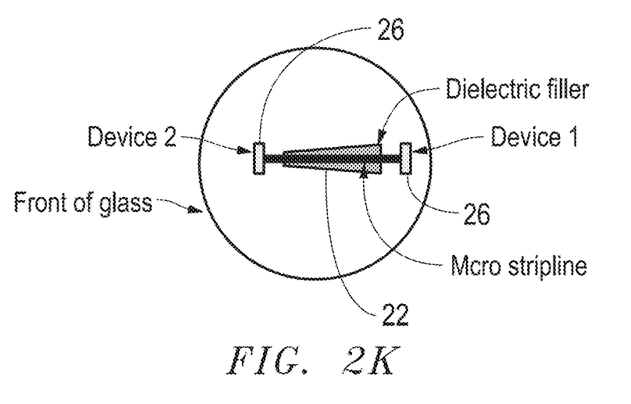
FIG. 2K is a top view after the impedance matching micro strip line is used to connect a variety of devices depicted here as Device 1 and Device 2.

FIG. 2L is a top view after the impedance matching micro strip line is used to connect a variety of devices depicted here as Device 1 and Device 2 at contacts 26.

Figure 3A:
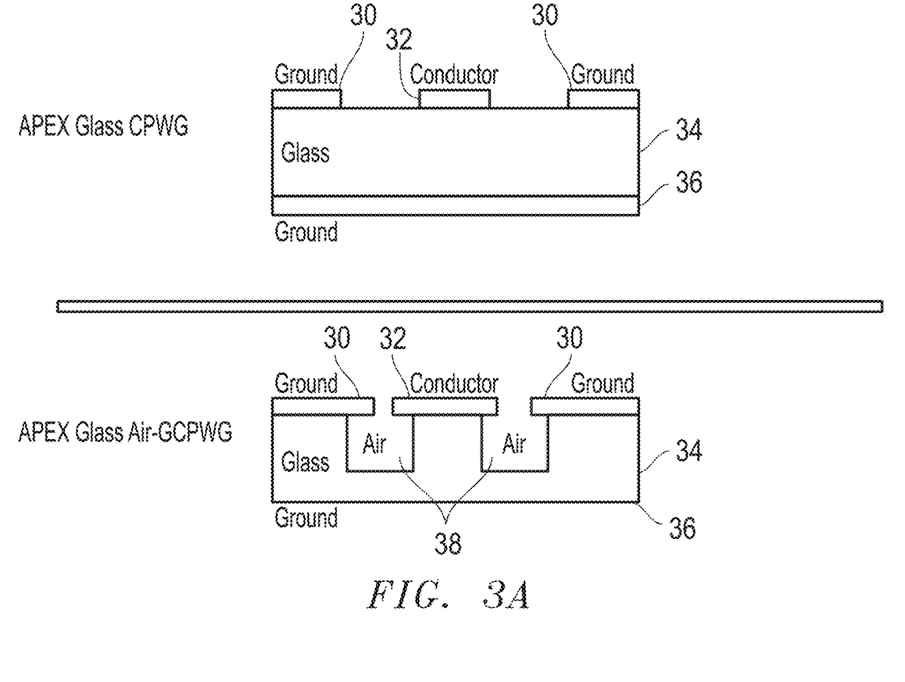
FIG. 3A shows a cross-sectional view of the transmission lines of the present invention.
Figure 3B:
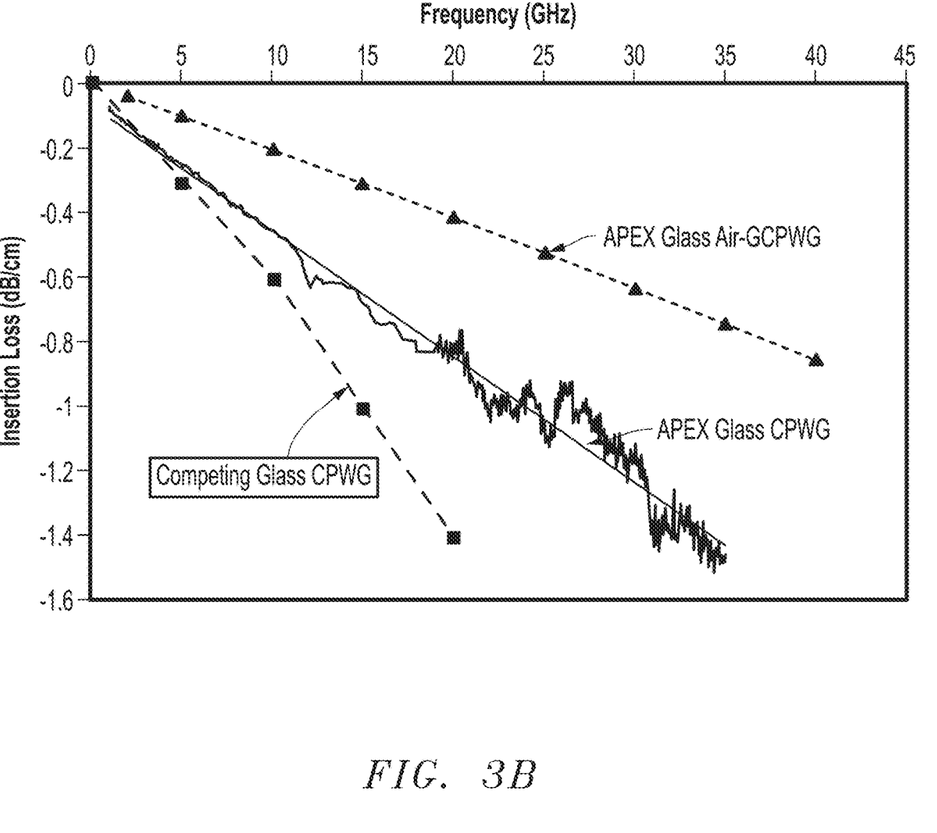
FIG. 3B is a graph that shows a comparison of the losses of the low loss micro-transmission line of the present invention, when compared to standard glass.

FIG. 3A top shows a cross-sectional view of the transmission line of the present invention that includes: grounds 30, conductor 32, photodefinable glass substrate 34 and ground 36. FIG. 3B (bottom) shows another example of the transmission line of the present invention that includes an air-gap, and the figures shows the grounds 30, the conductor 32, the photodefinable glass substrate 34, the ground 36, and air gaps (dielectric) 38.

FIG. 3B is a graph that shows a comparison of the losses of the low loss micro-transmission line of the present invention, when compared to standard glass.

Thus, the present invention has built and simulated a micro strip line using air as the dielectric material, the width of the dielectric trapezoid W1 is at 100 μm and is reduced to W2 to 50 μm. Again, the loss tangent for APEX glass is defined to be 0.02 at 60 GHz. All metals are 10 μm thick Cu with a 500 Å Ti adhesion layer, however, the skilled artisan will recognize that the requirements of a device (overall power, current, resistance, etc.) will dictate the materials used, the thickness and length of the device, and the tolerance to signal-to-noise ratio, etc., to accommodate the specific requirements of the device, as will be known to the skilled artisan in light of the specification and the formulas hereinabove. The photodefinable glass substrate used in this example has a 6" diameter and 300 μm thickness, however, both of those can easily be varied as will be known to the skilled artisan. The insertion loss for this 1 cm long line is 0.495 dB at 60 GHz. This level of insertion loss is unprecedented in RF devices particularly compared to PCB based RF products.

The present inventors used a photo-definable glass ceramic (APEX®) Glass Ceramic or other photo definable glass as a novel substrate material for semiconductors, RF electronics, microwave electronics, electronic components and/or optical elements. In general, a photo definable glass is processed using first generation semiconductor equipment in a simple three step process and the final material can be fashioned into either glass, ceramic, or contain regions of both glass and ceramic. Low loss micro-transmission transmission lines are the base line structure that enable, e.g.: Time Delay Networks, Directional Couplers Biased Tees, Fixed Couplers, Phase Array Antenna, Filters and Diplexers, Baluns, Power Combiners/Dividers and Power Amplifiers, at frequencies from MHz to THz devices thereby dramatically improving the efficiency and performance. The low loss micro-transmission transmission lines are the base line structure that enable, e.g.: Time Delay Networks, Directional Couplers Biased Tees, Fixed Couplers, Phase Array Antenna, Filters and Diplexers, Baluns, Power Combiners/Dividers and Power Amplifiers, at frequencies from MHz to THz devices while reducing the size. Alternatively, the low loss micro-transmission transmission lines at frequencies from MHz to THz devices can thereby dramatically improving the efficiency and performance and reducing the size.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), property(ies), method/process steps or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

To aid the Patent Office, and any readers of any patent issued on this application in interpreting the claims appended hereto, applicants wish to note that they do not intend any of the appended claims to invoke paragraph 6 of 35 U.S.C. § 112, U.S.C. § 112 paragraph (f), or equivalent, as it exists on the date of filing hereof unless the words "means for" or "step for" are explicitly used in the particular claim.

For each of the claims, each dependent claim can depend both from the independent claim and from each of the prior dependent claims for each and every claim so long as the prior claim provides a proper antecedent basis for a claim term or element.

What is claimed is:

1. A method of making an RF impedance matching device between two RF devices on a single substrate comprising:
    providing a single photosensitive glass substrate comprising silica, lithium oxide, aluminum oxide, and cerium oxide, wherein a first RF device and a second RF device are formed on or in the photosensitive glass substrate;
    masking a design layout comprising one or more structures to form one or more triangular or trapezoidal vias on the photosensitive glass substrate;
    exposing at least one portion of the photosensitive glass substrate to an activating energy source;
    heating the photosensitive glass substrate for at least ten minutes above its glass transition temperature;
    cooling the photosensitive glass substrate to transform at least part of the at least one portion of the photosensitive glass substrate to a crystalline material to form a glass-crystalline substrate;
    etching the glass-crystalline substrate with an etchant solution to form the one or more triangular or trapezoidal vias;
    filling the one or more triangular or trapezoidal vias with a non-conductive medium having a dielectric constant that is different from a dielectric constant of the photosensitive glass substrate; and
    forming one or more conductive structures to traverse the one or more triangular or trapezoidal vias, wherein the one or more conductive structures are configured to be connected to the first RF device and to the second RF device.

2. The method of claim 1, wherein the RF impedance matching device has mechanical support under less than 50% of a length or width of the RF impedance matching device.

3. The method of claim 1, wherein a height of a mechanical support is greater than 10 μm reducing RF losses.

4. The method of claim 1, wherein a lateral distance between RF impedance matching device and the photosensitive glass substrate is greater than 10 μm reducing RF losses.

5. The method of claim 1, wherein the step of etching forms an air gap between the photosensitive glass substrate and the RF impedance matching device, wherein the RF impedance matching device is connected to other RF electronic elements.

6. The method of claim 1, wherein the one or more conductive structures comprise at least one of a microstrip, a stripline, a coplanar wave guide, a grounded coplanar wave guide, or a coaxial waveguide.

7. The method of claim 1, wherein the one or more conductive structures comprise one or more metals, and wherein the one or more metals are selected from Fe, Cu, Au, Ni, In, Ag, Pt, or Pd.

8. The method of claim 1, wherein the the one or more conductive structures are configured to be connected to the first RF device and to the second RF device through a surface contact, a buried contact, a blind via, a glass via, a straight line contact, a rectangular contact, a polygonal contact, or a circular contact.

9. The method of claim 1, wherein the photosensitive glass substrate is a glass substrate comprising a composition of: 60-76 weight % silica; at least 3 weight % $K_2O$ with 6 weight % -16 weight % of a combination of $K_2O$ and Na2O; 0.003-1 weight % of at least one oxide selected from the group consisting of $Ag_2O$ and $Au_2O$; 0.003-2 weight % $Cu_2O$; 0.75 weight % -7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$.

10. The method of claim 1, wherein the photosensitive glass substrate is a glass substrate comprising a composition of: 35-76 weight % silica, 3-16 weight % $K_2O$, 0.003-1 weight % $Ag_2O$, 0.75-13 weight % $B_2O_3$, 8-15 weight % $Li_2O$, and 0.001-0.1 weight % $CeO_2$.

11. The method of claim 1, wherein the photosensitive glass substrate is at least one of:
a photo-definable glass substrate comprises at least 0.3 weight % $Sb_2O_3$ or $As_2O_3$; a photo-definable glass substrate comprises 0.003-1 weight % $Au_2O$; a photo-definable glass substrate comprises 1-18 weight % of an oxide selected from the group consisting of CaO, ZnO, PbO, MgO and BaO; and has an anisotropic-etch ratio of exposed portion to said unexposed portion is at least one of 10-20:1; 21-29:1; 30-45:1; 20-40:1; 41-45:1; and 30-50:1.

12. The method of claim 1, wherein the RF impedance matching device has a loss of less than 50% of a signal input versus a signal output.

13. The method of claim 1, further comprising forming the RF impedance matching device into a feature of at least one of a Time Delay Network, a Directional Couplers Biased Tee, a Fixed Coupler, a Phase Array Antenna, a Filter and Duplexer, a Balun, a Power Combiner/Divider, or a Power Amplifier.

14. A method of making a conductive structure for an RF impedance matching device between two RF devices on a single substrate comprising:
providing a single photosensitive glass substrate comprising silica, lithium oxide, aluminum oxide, and cerium oxide, wherein a first RF device and a second RF device are formed on or in the photosensitive glass substrate;

masking a design layout comprising one or more conductive structures to form one or more triangular or trapezoidal vias on the photosensitive glass substrate;
exposing at least one portion of the photosensitive glass substrate to an activating energy source;
processing the photosensitive glass substrate to a heating phase of at least ten minutes above its glass transition temperature;
cooling the photosensitive glass substrate to transform at least part of the at least one portion of the photosensitive glass substrate to a crystalline material to form a glass-crystalline substrate;
etching the glass-crystalline substrate with an etchant solution to form the one or more triangular or trapezoidal vias, wherein the RF impedance matching device has mechanical support by less than 50% of the length or width of the RF impedance matching device by the photosensitive glass substrate;
filling the one or more triangular or trapezoidal vias with a non-conductive medium having a dielectric constant that is different from a dielectric constant of the photosensitive glass substrate; and
forming the one or more conductive structures to traverse the one or more triangular or trapezoidal vias, wherein the one or more conductive structures are configured to be connected to the first RF device and to the second RF device.

15. The method of claim 14, wherein the one or more conductive structures comprise at least one of: a microstrip, a stripline, a coplanar wave guide, a grounded coplanar wave guide, or a coaxial waveguide.

16. The method of claim 14, wherein a height of the mechanical support is greater than 10 μm reducing RF losses.

17. The method of claim 14, wherein a lateral distance between the one or more conductive structures and the photosensitive glass substrate is greater than 10 μm reducing RF losses.

18. The method of claim 14, wherein the step of etching forms an air gap between the photosensitive glass substrate and the RF impedance matching device, wherein the RF impedance matching device is connected to other RF electronic elements.

19. The method of claim 14, wherein the one or more conductive structures comprise one or more metals, and wherein the one or more metals are selected from Fe, Cu, Au, Ni, In, Ag, Pt, or Pd.

20. The method of claim 14, wherein the photosensitive glass substrate is a glass substrate comprising a composition of: 60-76 weight % silica; at least 3 weight % $K_2O$ with 6 weight % -16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight % -7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$.

21. The method of claim 14, wherein the photosensitive glass substrate is a glass substrate comprising a composition of: 35-76 weight % silica, 3-16 weight % $K_2O$, 0.003-1 weight % $Ag_2O$, 0.75-13 weight % $B_2O_3$, 8-15 weight % $Li_2O$, and 0.001-0.1 weight % $CeO_2$.

22. The method of claim 14, wherein the photosensitive glass substrate is at least one of: a photo-definable glass substrate comprises at least 0.3 weight % $Sb_2O_3$ or $As_2O_3$; a photo-definable glass substrate comprises 0.003-1 weight % $Au_2O$; a photo-definable glass substrate comprises 1-18 weight % of an oxide selected from the group consisting of CaO, ZnO, PbO, MgO and BaO; and has an anisotropic-etch ratio of exposed portion to said unexposed portion is at least one of 10-20:1; 21-29:1; 30-45:1; 20-40:1; 41-45:1; and 30-50:1.

23. The method of claim 14, wherein the RF impedance matching device has a loss of less than 50% of a signal input versus a signal output.

24. The method of claim 14, further comprising forming the RF impedance matching device into a feature of at least one of a Time Delay Network, a Directional Couplers Biased Tee, a Fixed Coupler, a Phase Array Antenna, a Filter and Duplexer, a Balun, a Power Combiner/Divider, or a Power Amplifier.

* * * * *